US005446426A

United States Patent [19]

Wu et al.

[11] Patent Number: 5,446,426

[45] Date of Patent: Aug. 29, 1995

[54] MICROWAVE POWER COMBINER

[75] Inventors: Jen-chau Wu; Chi-Nan Chen, both of Hsinchu, Taiwan

[73] Assignee: Industrial Technology Research Institute, Hsinchu, Taiwan

[21] Appl. No.: 365,050

[22] Filed: Dec. 27, 1994

[51] Int. Cl.[6] .......................... H01P 5/12; H03F 3/60

[52] U.S. Cl. ..................................... 333/125; 330/287

[58] Field of Search ............... 333/125, 127, 136, 137; 330/56, 286, 295, 287

[56] References Cited

U.S. PATENT DOCUMENTS

| | | | |
|---|---|---|---|
| 4,175,257 | 11/1979 | Smith et al. | 330/287 |
| 4,453,139 | 6/1984 | Labaar | 331/47 |
| 4,684,874 | 8/1987 | Swift et al. | 333/125 |
| 4,933,651 | 6/1990 | Benahim et al. | 333/125 |
| 5,001,443 | 3/1991 | Martin, III | 333/26 |

OTHER PUBLICATIONS

"Millimeter-Wave Power-Combining Techniques", by Chang and Sun, IEEE Transactions on Microwave Theory and Techniques, vol. MTT-31, Feb. 1993, pp. 91-107.

*Primary Examiner*—Paul Gensler
*Attorney, Agent, or Firm*—George O. Saile; Larry J. Precott

[57] ABSTRACT

A microwave power combiner is formed in a cylindrical hollow metallic housing utilizing a number of pie shaped chambers formed with metallic vanes attached to and extending radially inward from the interior sidewalls of the cylindrical hollow metallic housing. Individual microwave power sources exterior to the cylindrical hollow metallic housing transmit energy into the pie shaped chambers. Two ring shaped metallic vane straps are used to control impedance mismatches and the resonant frequency of the microwave power combiner. The microwave power from the individual microwave power sources combine in the cylindrical hollow metallic housing and is extracted through the circular top of the cylindrical hollow metallic housing by means of a waveguide or a transmission line. The individual microwave power sources can be replaced as needed without affecting impedance matching or the efficiency of power transfer. There is flexibility in the number of individual microwave power sources used.

19 Claims, 2 Drawing Sheets

MICROWAVE POWER COMBINER

BACKGROUND OF THE INVENTION

1. Field of the Invention

This invention relates to a microwave power combiner using magnetron type construction. The microwave power combiner uses individual power sources which can be changed individually without causing problems of impedance mismatch and efficiency of power transmission.

2. DESCRIPTION OF THE RELATED ART

The cost of microwave power sources producing large amounts of microwave power becomes very expensive as the microwave power level increases. To help produce microwave energy economically microwave power combiners are used to combine the microwave power output of a number of smaller power sources. In "Millimeter-Wave Power-Combining Techniques," by Chang and Sun, IEEE Transactions on Microwave Theory and Techniques, vol. MTT-31, February 1983, pages 91–107, a resonant cavity is discussed which uses a modified waveguide to combine the power of 12 diodes. Microwave power combiners are described in U.S. Pat. No. 4,175,257 to Smith et al, in U.S. Pat. No. 4,453,139 to Labaar, in U.S. Pat. No. 4,684,874 to Swift et al, and in U.S. Pat. No. 5,001,443 to Martin, III.

This invention provides a power combiner which combines a number of microwave power sources with good efficiency of power transfer. The individual microwave power sources can be replaced easily without causing impedance mismatch and loss of efficiency of power transfer. There is flexibility in the number of individual microwave power sources used.

SUMMARY OF THE INVENTION

It is the principle objective of this invention to provide a microwave power combiner to combine power from a number of microwave power sources economically.

It is a further objective of this invention to provide a microwave power combiner in which individual microwave power sources can be changed easily and without problems with impedance mismatches.

It is a further objective of this invention to provide a microwave power combiner for which there is flexibility in the number of individual microwave power sources used.

These objectives are achieved with a microwave power combiner formed inside a cylindrical hollow metallic housing. The cylindrical hollow metallic housing is formed with cylindrical sidewalls, a circular top and a circular bottom, There are an even number of pie shaped compartments, one half of which are power compartments and the other half passive compartments, inside the housing equal to twice the number of individual microwave power sources to be used. Each power compartment is between two passive compartments and each passive compartment is between two power compartments. An even number of vanes, equal to twice the number of individual microwave power sources to be used are evenly spaced around the circumference of the cylindrical sidewalls inside the housing, attached to the cylindrical sidewalls, and extend radially inward from the cylindrical sidewalls. Power entry slots are formed in those portions of the cylindrical sidewall of the cylindrical hollow metallic housing forming the boundaries of the power compartments.

A number of individual microwave power sources, equal to the number of power compartments, are attached to the cylindrical sidewail, external to the cylindrical hollow metallic housing, with one individual microwave power source covering each power entry slot. Each individual microwave power source includes a resonant cavity tuned to the operating frequency of the power combiner. A power exit slot or probe is formed in the circular top of the housing at the center of the circular top. A power extraction unit, such as a waveguide or transmission line, is attached to the circular top of the housing, external to the housing, and covering the power exit slot or probe. Two metallic vane straps, comprised of two metal rings concentric with the cylindrical sidewalls, are formed one at the top and one at the bottom of the metallic vanes. The top metallic vane strap is electrically connected to alternate metallic vanes. The bottom metallic vane strap is electrically connected to the remaining metallic vanes. The top metallic vane strap and the bottom metallic vane strap are each electrically connected to one half of the metallic vanes, the top metallic vane strap and the bottom metallic vane strap are not electrically connected to the same metallic vane, the top metallic vane strap is not electrically connected to adjacent metallic vanes, and the bottom metallic vane strap is not electrically connected to adjacent metallic vanes. The metallic vane straps are adjusted to control impedance mismatches and the resonant frequency of the microwave power combiner.

In operation microwave power is supplied to the individual microwave power units and transmitted into the power compartments through the power entry slots in the cylindrical sidewall of the cylindrical hollow metallic housing. The power transfer sets up an electric field inside the housing oriented along the circumference of the cylindrical sidewall. After the microwave energy is transferred into the cylindrical hollow metallic housing the power of the individual microwave power units combine. The microwave power is then transferred to the power extraction unit, such as a waveguide or transmission line, through the power exit slot or probe in the circular top of the housing.

Individual microwave power units and the power extraction unit can be replaced as it becomes necessary without causing impedance mismatches or affecting the efficiency of operation of the microwave power combiner. There is flexibility in the number of individual microwave power units used. The flexibility and ease of replacement make the microwave power combiner of this invention a very economical means of combining microwave power from a number of smaller sources into a larger source of microwave power.

DESCRIPTION OF THE PREFERRED EMBODIMENTS

Figure 1:
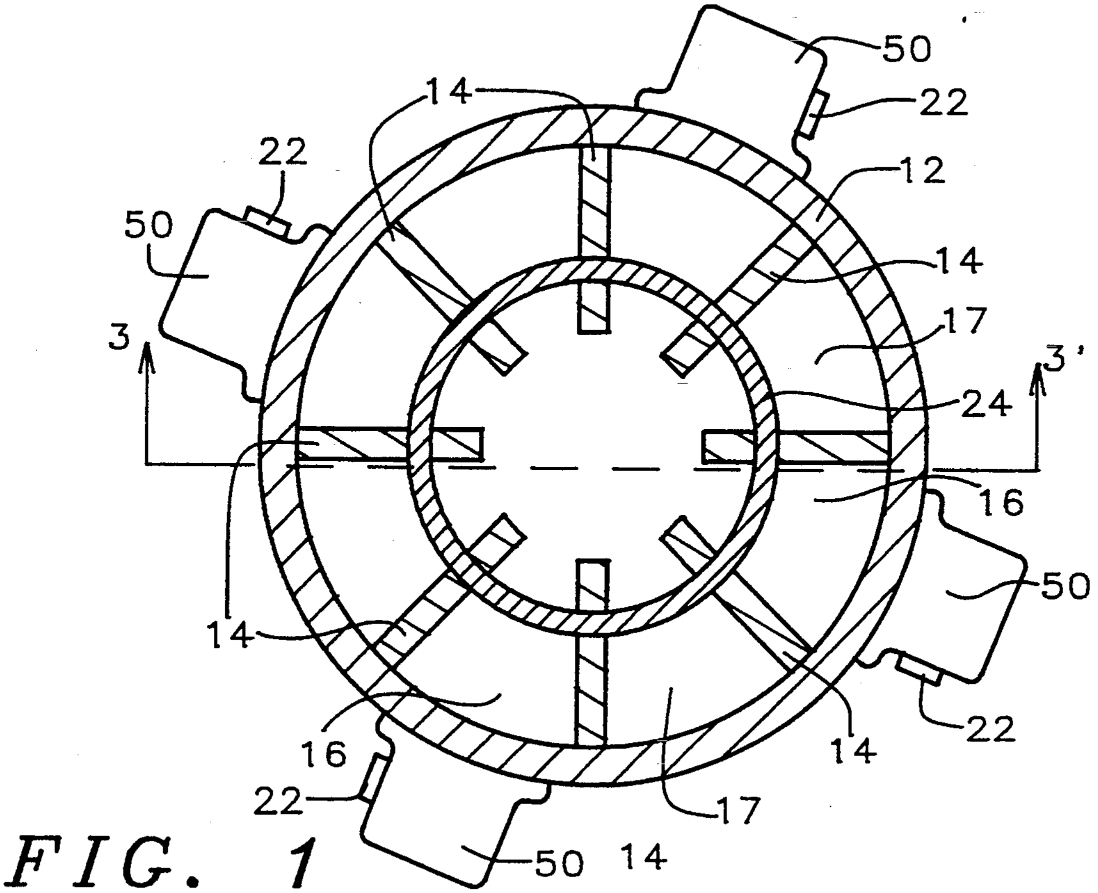
FIG. 1 is a cross section view of the microwave power combiner along the line 1–1′ of FIG. 3.
Figure 2:
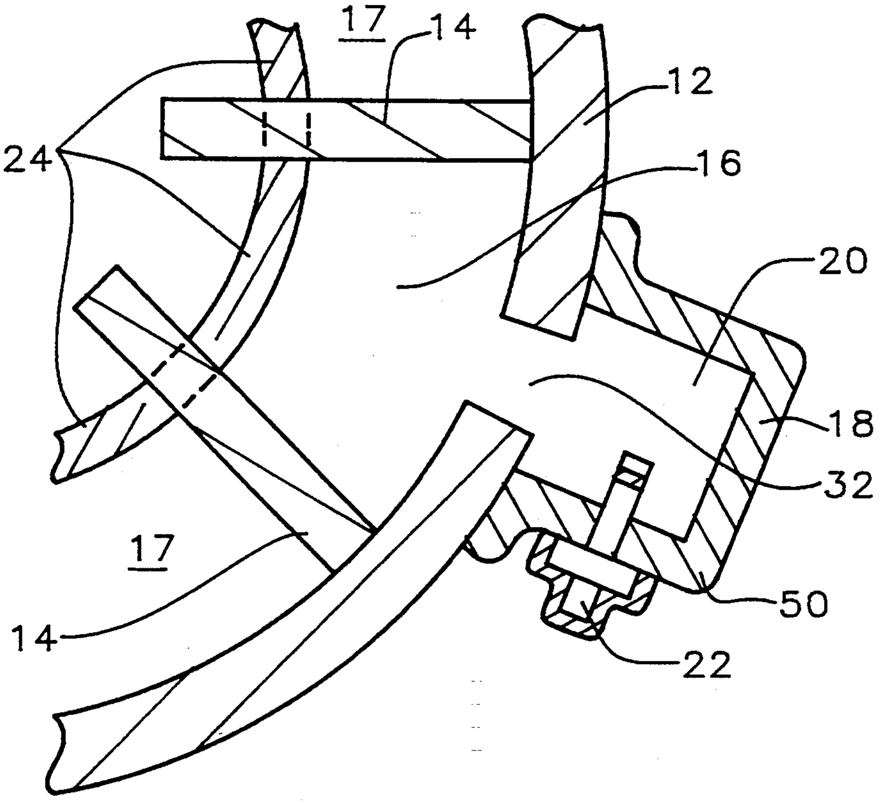
FIG. 2 is an expanded cross section view of a power compartment of the microwave power combiner along the line 2–2′ of FIG. 3.

Referring now to FIG. 1, FIG. 2, FIG. 3, and FIG. 4, there is shown the principle embodiment of this invention. The microwave power combiner is comprised of a cylindrical hollow metallic housing having a circular top, a circular bottom, and a cylindrical sidewall. FIG. 1 shows a cross section view of the microwave power combiner for a section taken parallel to the circular top and circular bottom of the housing near the top of the housing and above the top metallic vane strap, as indicated by section line 1–1′ in FIG. 3. FIG. 2 shows an expanded cross section view of one of the power compartments for a section taken parallel to the circular top and circular bottom of the housing midway between the top and bottom of the housing, as indicated by section line 2–2′ in FIG. 3.

As shown in FIG. 1 there are an even number of metallic vanes 14, eight in this embodiment, attached to the cylindrical sidewall 12 of the cylindrical hollow metallic housing. The cylindrical hollow metallic housing and the metallic vanes 14 are formed of a metal such as aluminum, or copper plated with silver or gold. The inside diameter of the cylindrical hollow metallic housing is between about 35 and 65 millimeters, and the inside height of the housing is between about 30 and 60 millimeters. The metallic vanes 14 are attached to the cylindrical sidewall, spaced evenly around the circumference of the cylindrical sidewall, and extend radially inward from the cylindrical sidewall for a distance of between about 9 and 1.4 millimeters. The cylindrical sidewall and metallic vanes form an even number of compartments 16, 17 equal to the number of metallic vanes, eight in this embodiment. One half of the compartments are power compartments 16 and the other half of the compartments are passive compartments 17. The power compartments 16 and the passive compartments 17 alternate so that each power compartment 16 is adjacent to two passive compartments 17. A number of power entry slots, equal to the number of power compartments, are formed in those parts of the cylindrical sidewall forming the boundary of each power compartment 16. A number of power units 50, equal to the number of power compartments 16, are attached to the exterior of the cylindrical sidewall wherein one power unit 50 covers each power entry slot. Two metallic vane straps 24, comprised of two metal rings concentric with the cylindrical sidewalls, are formed one at the top and one at the bottom of the metallic vanes 14. The top metallic vane strap is electrically connected to alternate metallic vanes. The bottom metallic vane strap is electrically connected to the remaining metallic vanes. The top metallic vane strap and the bottom metallic vane strap are each electrically connected to one half of the metallic vanes, the top metallic vane strap and the bottom metallic vane strap are not electrically connected to the same metallic vane, the top metallic vane strap is not electrically connected to adjacent metallic vanes, and the bottom metallic vane strap is not electrically connected to adjacent metallic vanes. The metallic vane straps control impedance mismatches and the resonant frequency of the power combiner. It is important to connect the metallic vane straps in this manner because so connected the vane straps stabilize the frequency of operation. Power units are attached to the cylindrical sidewalls external to the cylindrical hollow metallic housing covering each power entry slot 32.

FIG. 2 shows an expanded view of one of the power compartments 16 with the power unit 50 covering the power entry slot 32. The power unit 50 has a first metallic shell 18, a first resonant cavity 20, and a power source 22. In this embodiment the first metallic shell is aluminum, the power source is an IMPATT diode operating at a frequency of 2450 MHz and the first resonant cavity 20 is tuned to resonate at the power source frequency. The power source may also be a Gunn diode.

Figure 3:
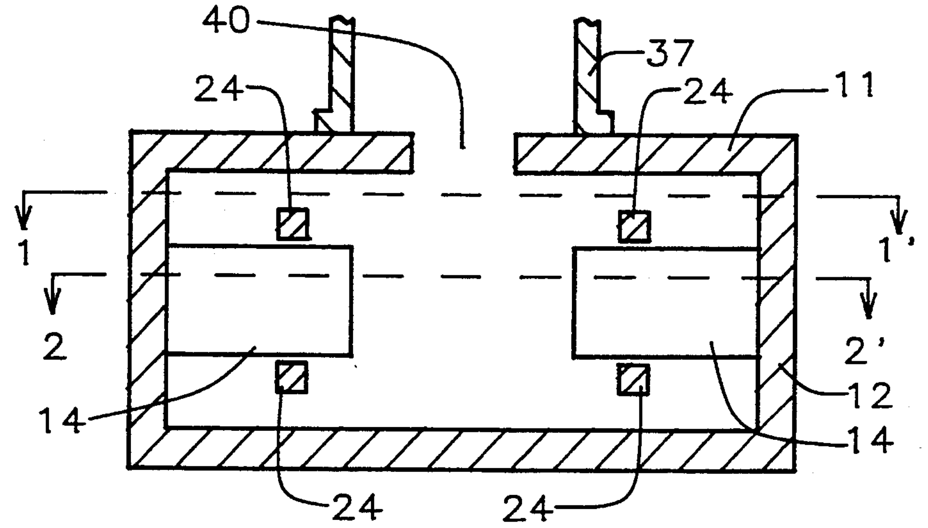
FIG. 3 is a cross section view of the microwave power combiner along the line 3–3′ of FIG. 1 showing power extracted with a transmission line which is a waveguide.
Figure 4:
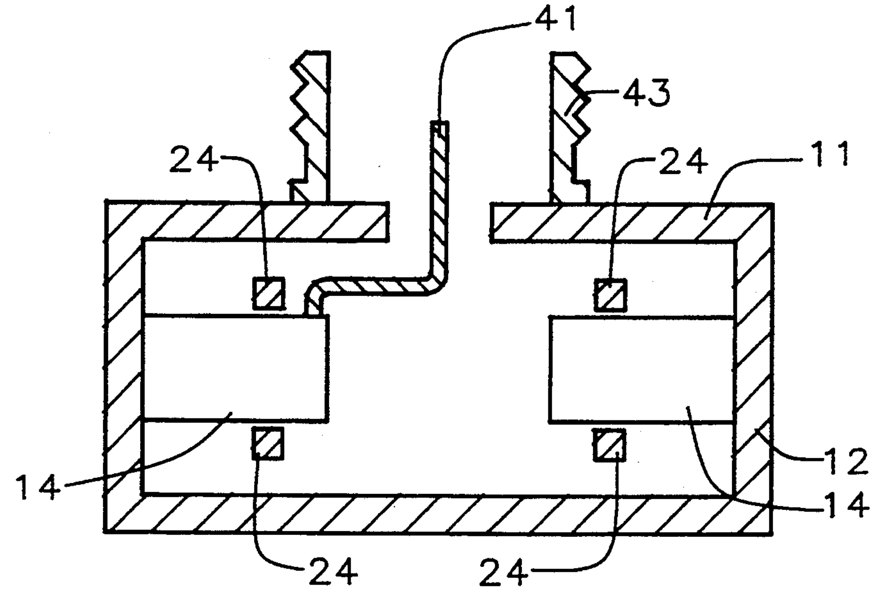
FIG. 4 is a cross section view of the microwave power combiner along the line 3–3′ of FIG. 1 showing power extracted with a transmission line which is a short coaxial line or probe.

As shown in FIG. 3 and FIG. 4 power is extracted from the microwave power combiner through the circular top 11 of the cylindrical hollow metallic housing. In one method of power extraction, as shown in FIG. 3, a power exit slot 40 is formed in the circular top 11 of the cylindrical hollow metallic housing and at the center of the circular top 11. Microwave power is coupled through the power exit slot 40 into a waveguide 37 mounted over the power exit slot 40. In another method of power extraction, shown in FIG. 4, a center conductor 41 for a coaxial line connector 43 mounted over the power exit slot 40 is electrically connected to one of the metallic vanes 14. The coaxial line connector 43 is connected to a short coaxial line or probe, not shown.

Refer now to FIG. 1 and FIG. 2. In the operation of the power combiner microwave power at a frequency of 2450 MHz is introduced into the first resonant cavities 20 by the power sources 22. The microwave power is introduced into the power chambers 16 through the power entry slots 32 setting up an electric field in the power chambers 16 and the passive chambers 17 oriented along the circumference of the cylindrical sidewall 12. The vane straps 24 each have the same diameter which is adjusted to control impedance and the resonant frequency within the microwave power combiner. The diameter of the vane straps is determined by experiment, with the mean diameter being between about 10 and 20 millimeters. The key variables which are adjusted to produce the desired resonant frequency of operation are the diameter of the vane straps 24, the number of metallic vanes 14, the length of the metallic vanes 14, and the diameter of the cylindrical metallic housing.

Two methods of extracting microwave power from the microwave power combiner are shown in FIG. 3 and FIG. 4. In the first method, shown in FIG. 3, the microwave power coupled through the power exit slot 40 in the circular top of the cylindrical hollow metallic housing into a waveguide 37. In the second method, shown in FIG. 4, the microwave power is coupled to a coaxial cable or probe, not shown, through a coaxial connector 43 having a center conductor 41 electrically connected to one vane 14.

Individual microwave power sources can be replaced if they become defective. Individual power units and the power extraction unit can be replaced if desired. By changing the number of metallic vanes the microwave power combiner can be formed with more than four microwave power sources.

While the invention has been particularly shown and described with reference to the preferred embodiments thereof, it will be understood by those skilled in the art that various changes in form and details may be made without departing from the spirit and scope of the invention.

What is claimed is:

1. A microwave power combiner, comprising:

a cylindrical hollow metallic housing having a circular top, a circular bottom, and a cylindrical sidewall;

an even number of metallic vanes within said cylindrical hollow metallic housing attached to said cylindrical sidewall, evenly spaced about the circumference of said cylindrical sidewall, and extending radially inward from said cylindrical sidewall;

a first ring shaped metallic vane strap having an inner diameter, an outer diameter, and a mean diameter concentric with said cylindrical hollow metallic housing mounted above said metallic vanes and electrically connected to alternate said metallic vanes;

a second ring shaped metallic vane strap having an inner diameter, an outer diameter, and a mean diameter concentric with said cylindrical hollow metallic housing mounted below said metallic vanes and electrically connected to those alternate said metallic vanes not connected to said first ring shaped metallic vane strap;

an even number of compartments equal to the number of said metallic vanes formed within said cylindrical hollow metallic housing, the boundaries of each said compartment comprising two adjacent said metallic vanes, said top of said cylindrical hollow metallic housing, said bottom of said cylindrical hollow metallic housing, and said cylindrical sidewall wherein one half of said compartments are power compartments, one half of said compartments are passive compartments and each said power compartment is between two said passive compartments;

a number of power entry slots equal to the number of said power compartments formed in said cylindrical sidewall each said power entry slot located in that portion of said cylindrical sidewall forming one said boundary of one said power compartment;

a number of power units equal to the number of power entry slots attached to said cylindrical sidewall exterior to said cylindrical hollow metallic housing each said power unit covering one said power entry slot;

a power source attached to each said power unit;

a power exit slot formed in said circular top of said cylindrical hollow metallic housing at the center of said circular top of said cylindrical hollow metallic housing; and means for extracting microwave power from said microwave power combiner.

2. The microwave power combiner of claim 1 wherein said means for extracting microwave power comprises a waveguide attached to said circular top, external to said cylindrical hollow metallic housing, and covering said power exit slot.

3. The microwave power combiner of claim 1 wherein said means for extracting microwave power comprises a coaxial connector attached to said circular top, external to said cylindrical hollow metallic housing, and covering said power exit slot having a center conductor extending through said power exit slot and electrically connected to one said metallic vane.

4. The microwave power combiner of claim 1 wherein the inside diameter of said cylindrical hollow metallic housing is between about 35 and 65 millimeters.

5. The microwave power combiner of claim 1 wherein the inside height of said cylindrical hollow metallic housing is between about 30 and 60 millimeters.

6. The microwave power combiner of claim 1 wherein said even number of said metallic vanes is eight.

7. The microwave power combiner of claim 1 wherein said metallic vanes extend radially inward from said cylindrical sidewall a distance of between about 9 and 14 millimeters.

8. The microwave power combiner of claim 1 wherein said first ring shaped metallic vane strap and said second ring shaped metallic vane strap have the same said inner diameter, said outer diameter, and said mean diameter.

9. The microwave power combiner of claim 8 wherein said mean diameter of said first ring shaped metallic vane strap and said second ring shaped metallic vane strap is between about 10 and 20 millimeters.

10. The microwave power combiner of claim 1 wherein each said power unit is comprised of a microwave power source and a first metallic resonant cavity wherein said first metallic resonant cavity resonates at the operating frequency of said microwave power source.

11. The microwave power combiner of claim 10 wherein said operating frequency of said microwave power source is 2450 MHz.

12. The microwave power combiner of claim 10 wherein said microwave power source is an IMPATT diode.

13. The microwave power combiner of claim 10 wherein said microwave power source is a Gunn diode.

14. The microwave power combiner of claim 1 wherein said cylindrical hollow metallic housing is formed of aluminum.

15. The microwave power combiner of claim 1 wherein said cylindrical hollow metallic housing is formed of copper plated with silver.

16. The microwave power combiner of claim 1 wherein said metallic vanes are formed of aluminum.

17. The microwave power combiner of claim 1 wherein said metallic vanes are formed of copper plated with silver.

18. The microwave power combiner of claim 1 wherein said cylindrical hollow metallic housing is formed of copper plated with gold.

19. The microwave power combiner of claim 1 wherein said metallic vanes are formed of copper plated with gold.

* * * * *